United States Patent
Kogure et al.

(10) Patent No.: US 11,590,909 B2
(45) Date of Patent: Feb. 28, 2023

(54) SEALING STRUCTURE OF CASE FOR IN-VEHICLE ELECTRONIC COMPONENTS

(71) Applicant: DENSO CORPORATION, Kariya (JP)

(72) Inventors: Shintaro Kogure, Kariya (JP); Kenshiro Hida, Kariya (JP)

(73) Assignee: DENSO CORPORATION, Kariya (JP)

( * ) Notice: Subject to any disclaimer, the term of this patent is extended or adjusted under 35 U.S.C. 154(b) by 24 days.

(21) Appl. No.: 16/844,821

(22) Filed: Apr. 9, 2020

(65) Prior Publication Data
US 2020/0231105 A1 Jul. 23, 2020

Related U.S. Application Data

(63) Continuation of application No. PCT/JP2018/037295, filed on Oct. 5, 2018.

(30) Foreign Application Priority Data

Oct. 10, 2017 (JP) .............................. JP2017-197047

(51) Int. Cl.
*B60R 16/02* (2006.01)
*B60R 16/023* (2006.01)
(Continued)

(52) U.S. Cl.
CPC ....... *B60R 16/0239* (2013.01); *H05K 5/0217* (2013.01); *H05K 5/03* (2013.01)

(58) Field of Classification Search
CPC ..... B60R 16/0239; H05K 5/0217; H05K 5/03
See application file for complete search history.

(56) References Cited

U.S. PATENT DOCUMENTS 5,703,325 A * 12/1997 Yamaguchi ............ H02G 3/088
174/50
6,407,925 B1 * 6/2002 Kobayashi ........... H05K 5/0052
200/61.88
(Continued)

FOREIGN PATENT DOCUMENTS

CN    201657565 U    11/2010
JP    S63-59383 U    4/1988
(Continued)

OTHER PUBLICATIONS

Dec. 25, 2018 International Search Report issued in International Patent Application No. PCT/JP2018/037295.

*Primary Examiner* — Rockshana D Chowdhury
*Assistant Examiner* — Douglas R Burtner
(74) *Attorney, Agent, or Firm* — Oliff PLC

(57) ABSTRACT

A sealing structure includes: a case that stores an in-vehicle electronic component and has an opening; and a first cover member that covers the opening of the case. The case includes: an protrusion member that has a sealing surface protruded to surround the opening; and a rib that is protruded on an opposite side of the opening with the protrusion member interposed therebetween. The rib has a discharge surface that is connected to the sealing surface of the protrusion member. The first cover member has an extension member that extends along the rib. The discharge surface of the rib is located to be lower than the sealing surface of the protrusion member while the case is arranged with the opening facing upward, and the extension member of the first cover member extends to be lower than the discharge surface of the rib.

4 Claims, 10 Drawing Sheets

(51) Int. Cl.
*H05K 5/02* (2006.01)
*H05K 5/03* (2006.01)

(56) References Cited

U.S. PATENT DOCUMENTS

| | | | |
|---|---|---|---|
| 7,561,435 B2 * | 7/2009 | Kamoshida | H05K 5/0052 |
| | | | 174/50.5 |
| 7,563,992 B2 * | 7/2009 | Lawlyes | H05K 5/062 |
| | | | 174/561 |
| 8,014,158 B2 * | 9/2011 | Kojima | H05K 5/062 |
| | | | 361/752 |
| 8,915,394 B2 * | 12/2014 | I | B60R 16/0239 |
| | | | 220/378 |
| 2010/0307814 A1 * | 12/2010 | Aoki | H05K 7/026 |
| | | | 174/520 |
| 2011/0100704 A1 * | 5/2011 | Iida | H05K 5/0069 |
| | | | 174/520 |
| 2011/0114354 A1 * | 5/2011 | Heien | B60R 16/0238 |
| | | | 174/50.5 |
| 2011/0259890 A1 * | 10/2011 | Hsu | H05K 5/061 |
| | | | 220/324 |
| 2012/0085766 A1 * | 4/2012 | I | H02G 3/088 |
| | | | 220/378 |
| 2012/0320544 A1 * | 12/2012 | Ohhashi | H05K 5/062 |
| | | | 361/752 |
| 2013/0120943 A1 * | 5/2013 | Tamura | H05K 5/069 |
| | | | 361/752 |
| 2014/0011058 A1 | 1/2014 | Adachi et al. | |
| 2014/0076772 A1 * | 3/2014 | Azumi | H05K 5/062 |
| | | | 206/706 |
| 2014/0334116 A1 * | 11/2014 | Lee | H05K 5/061 |
| | | | 361/752 |
| 2015/0146390 A1 * | 5/2015 | Park | G02F 1/133528 |
| | | | 361/752 |
| 2018/0192526 A1 * | 7/2018 | Suzuki | H05K 7/20418 |

FOREIGN PATENT DOCUMENTS

| | | |
|---|---|---|
| JP | 2009-75641 A | 4/2009 |
| JP | 2010-259208 A | 11/2010 |
| JP | 2016-178276 A | 10/2016 |

* cited by examiner

US 11,590,909 B2

SEALING STRUCTURE OF CASE FOR IN-VEHICLE ELECTRONIC COMPONENTS

CROSS-REFERENCE TO RELATED APPLICATION

The present application is a continuation application of International Application No. PCT/JP2018/037295, filed on Oct. 5, 2018, which claims priority to Japanese Patent Application No. 2017-197047, filed on Oct. 10, 2017. The contents of these applications are incorporated herein by reference in their entirety.

BACKGROUND

Technical Field

The present disclosure relates to a sealing structure of a case storing in-vehicle electronic devices.

Background Art

In the prior art, the battery unit is configured such that, when a cover is attached from above to a base (hereinafter, called "case") for storing electronic devices, a sealing member is provided on a sealing surface between the case and the cover, and the side surfaces of the case and the side surfaces of the cover overlap each other. According to this configuration, the side surfaces of the cover can prevent car washing water, for example, from directly hitting the sealing member.

SUMMARY

In the present disclosure, provided is a sealing structure of a case for an in-vehicle electronic component as the following.

In the sealing structure of a case for an in-vehicle electronic component,
a case includes:
a protrusion member that has a sealing surface protruded to surround an opening; and
a rib that is protruded on an opposite side of the opening with the protrusion member interposed therebetween,
the rib has a discharge surface that is connected to the sealing surface of the protrusion member,
a cover member has an extension member that extends along the rib,
the discharge surface of the rib is located to be lower than the sealing surface of the protrusion member while the case is arranged with the opening facing upward
the extension member of the cover member extends to be lower than the discharge surface of the rib, and
the rib has a concave part in the discharge surface.

BRIEF DESCRIPTION OF THE DRAWINGS

The foregoing and other objects, features, and advantages of the present disclosure will be more clarified by the following detailed descriptions with reference to the accompanying drawings. The drawings are as follows.

DETAILED DESCRIPTION OF THE PREFERRED EMBODIMENTS

Figure 1:
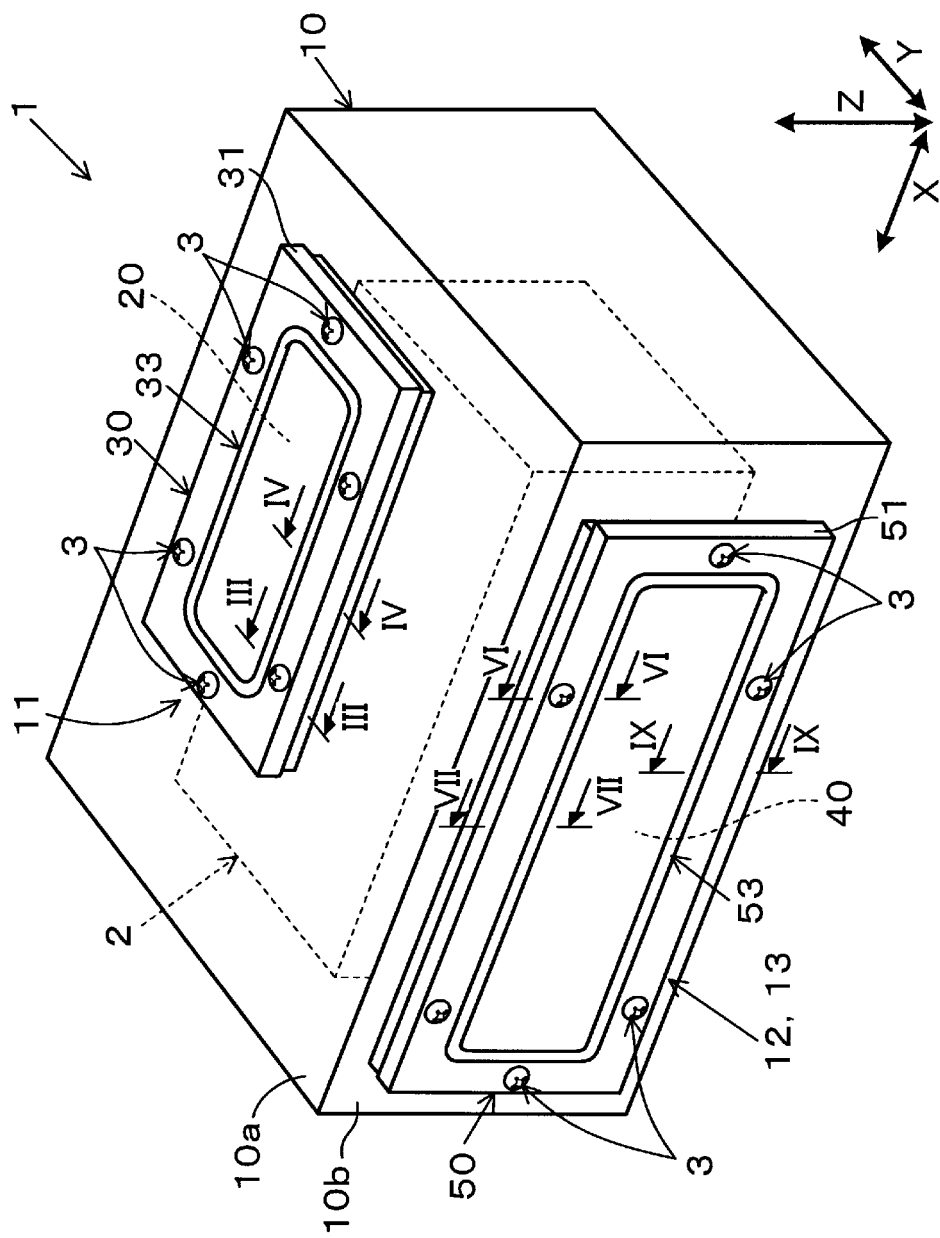
FIG. 1 is a perspective view of a power converter according to a first embodiment.

There has been conventionally a structure in a vehicle such as automobile in which a power converter and a battery unit as electronic devices, for example, are arranged in an engine room. In this structure, the electronic devices are exposed to various kinds of liquids including car washing water, muddy water, salt water, and rain water, and are highly susceptible to influences from these liquids.

[PTL 1] JP 2014-13723 A

The battery unit described in PTL 1 listed above may cause a problem that the liquid having entered into the sealing surface between the case and the cover is retained near the sealing part, and then deteriorates the sealing member and infiltrates into the case. This problem can occur in not only cases storing a battery unit but also cases storing various in-vehicle electronic devices.

An object of the present disclosure is to provide a sealing structure that prevents infiltration of a liquid into a case storing in-vehicle electronic components.

An aspect of the present disclosure is in a sealing structure of a case for in-vehicle electronic components, comprising:
a case that stores an in-vehicle electronic component and has an opening; and
a cover member that covers the opening of the case, wherein
the case includes:
a protrusion member that has a sealing surface protruded to surround the opening; and
a rib that is protruded on an opposite side of the opening with the protrusion member interposed therebetween,
the rib has a discharge surface that is connected to the sealing surface of the protrusion member,
the cover member has an extension member that extends along the rib, the discharge surface of the rib is located to be lower than the sealing surface of the protrusion member while the case is arranged with the opening facing upward the extension member of the cover member extends to be lower than the discharge surface of the rib, and the rib has a concave part in the discharge surface.

In the sealing structure, when the case is arranged with the opening facing upward, the extension member of the cover member can block a straight path in which an liquid would flows past the rib from outside and reach the sealing surface of the protrusion member. This prevents the liquid from directly hitting the sealing surface of the protrusion member due to its momentum, so that the liquid is unlikely to reach the sealing surface.

In addition, the discharge surface of the rib is located to be lower than the sealing surface of the protrusion member while the case is arranged with the opening facing upward, so that the liquid is prone to flow toward the discharge surface under gravity due to a difference in height between the discharge surface and the sealing surface, and is less prone to remain on the sealing surface of the protrusion member. This prevents liquid having entered into the sealing surface of the protrusion member from deteriorating the sealing surface and the sealing member provided on the sealing surface and infiltrating into the opening.

Thus, according to the aspect described above, it is possible to provide a sealing structure that prevents infiltration of a liquid into the case storing in-vehicle electronic components.

Reference signs parenthesized in the claims merely show correspondences with specific means in embodiments described below and do not limit the technical scope of the present disclosure.

Hereinafter, embodiments of a power converter will be described with reference to the drawings.

Unless otherwise specified, in the drawings of this specification, arrow X indicates a first direction that is the width direction of a case storing a plurality of in-vehicle electronic components and attached to a vehicle body, arrow Y indicates a second direction that is the depth direction of the case, and arrow Z indicates a third direction that is the height direction (vertical direction) of the case.

First Embodiment

As illustrated in FIG. 1, a power converter 1 according to a first embodiment is mounted in an electronic car, a hybrid car, or the like, for example, and is used as an inverter that converts direct-current supply power into alternating-current power necessary for driving a drive motor.

The power converter 1 includes a plurality of in-vehicle electronic components 2, a case 10, and cover members 30 and 50. The plurality of in-vehicle electronic components 2 are stored in the case 10. The plurality of in-vehicle electronic components 2 includes semiconductor modules with built-in semiconductor elements such IGBTs, and electronic components related to the semiconductor module, such as reactors, capacitors, and control circuit boards.

The first cover member 30 is fastened and fixed via a plurality of screw members 3 to cover an opening 20 of the case 10, the opening 20 is directed to a predetermined direction when the power converter 1 is used normally. Together with the case 10, the first cover member 30 constitutes a sealing structure 11 for the opening 20.

The opening 20 is an opening that penetrates through an upper surface 10a of the case 10 with the first direction X as a longitudinal direction. During normal use of the power converter 1, the opening 20 is covered with the first cover member 30. On the other hand, during assembly or maintenance of the power converter 1, personnel detach the first cover member 30 from the opening 20 to carry out work on the in-vehicle electronic components 2.

The second cover member 50 is fastened and fixed via a plurality of screw members 3 to cover an opening 40 of the case 10 that is arranged in normal orientation. Together with the case 10, the second cover member 50 constitutes sealing structures 12 and 13 for the opening 40.

The opening 40 is an opening that penetrates through an side surface 10b of the case 10 with the first direction X as the longitudinal direction. During normal use of the power converter 1, like the opening 20, the opening 40 is covered with the second cover member 50. On the other hand during assembly or maintenance of the power converter 1, personnel detach the second cover member 50 from the opening 40 to carry out work on the in-vehicle electronic components 2.

The material of the case 10 can be an aluminum-based metal material as an example, and a material of the cover members 30 and 50 can be an iron-based metal material as an example. However, various other materials can be used as necessary. For example, a material of at least either the case 10 or the cover members 30 and 50 can be a non-metal material such as a resin material.

Figure 2:
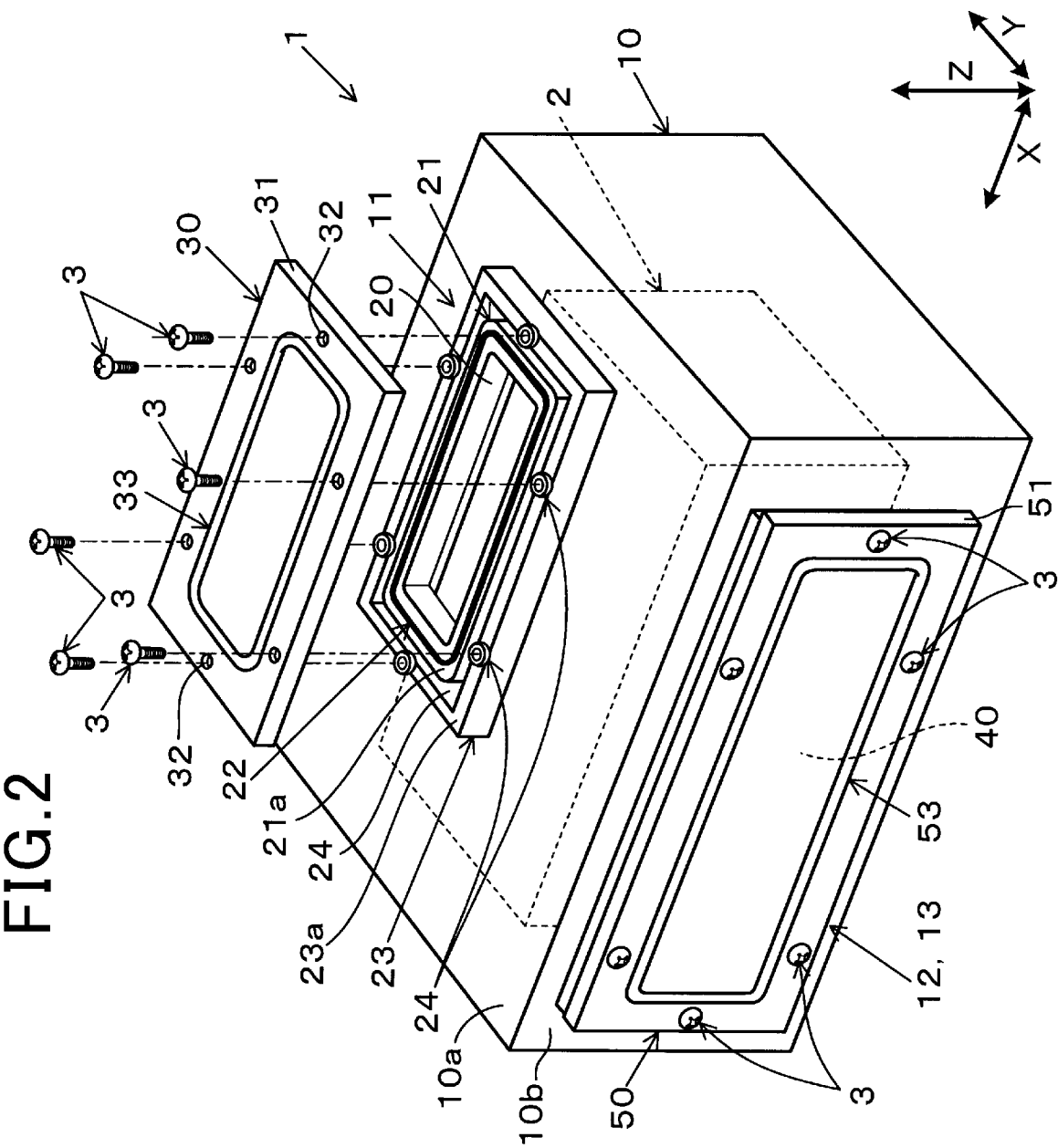
FIG. 2 is a diagram illustrating the power converter illustrated in FIG. 1 in which a first cover member is detached from a case.

As illustrated in FIG. 2, the case 10 includes a protrusion member 21 and a rib 23 on the upper surface 10a.

The protrusion member 21 has a sealing surface 21a that is annularly protruded to surround the opening 20. A sealing member 22 is arranged on the sealing surface 21a. The sealing member 22 is made of a gasket that is a liquid-tight fixing sealing material, and is stored and held in a space between a concave part 33 provided on the first cover member 30 and the sealing surface 21a of the protrusion member 21.

When the first cover member 30 is fastened and fixed to the case 10, the sealing surface 21a of the protrusion member 21 is joined to the back surface of the first cover member 30 via the sealing member 22, thereby to seal the opening 20.

The rib 23 is annularly protruded to surround the outer periphery of the protrusion member 21. That is, the rib 23 is protruded on the opposite side of the opening 20 with the protrusion member 21 interposed therebetween. The rib 23 has a discharge surface 23a that is connected to the sealing surface 21a of the protrusion member 21. The discharge surface 23a of the rib 23 is located to be lower than the sealing surface 21a of the protrusion member 21 while the case 10 is arranged with the opening 20 facing upward. In this case, the sealing surface 21a and the discharge surface 23a are adjacent to each other to form a step of a constant dimension between the sealing surface 21a and the discharge surface 23a.

The rib 23 also has a groove 24 that is a concave part in the discharge surface 23a. The groove 24 is configured as an annular groove to continuously extend along the protrusion member 21.

The sealing structure 11 will be described in detail with reference to FIGS. 3 and 4.

Figure 3:
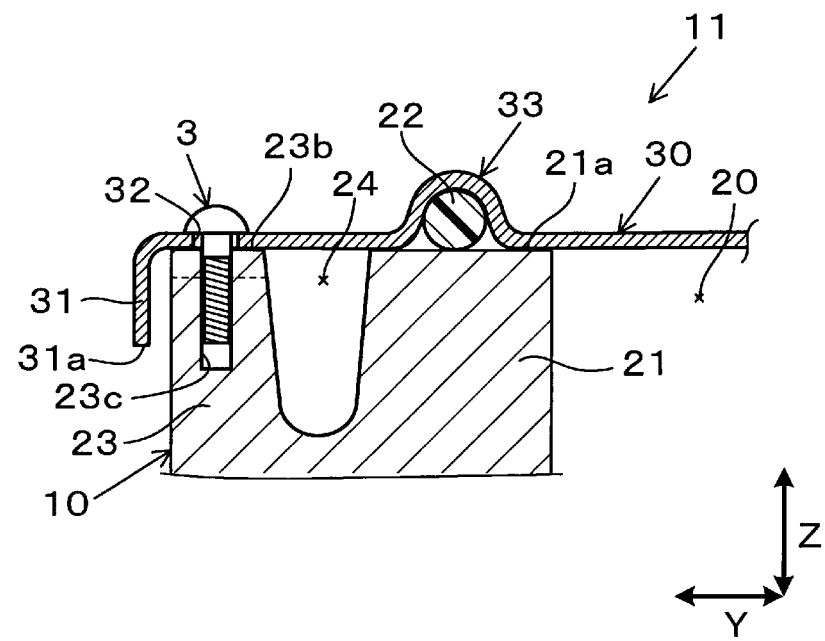
FIG. 3 is a cross-sectional view taken along line III-III of FIG. 1.

As illustrated in FIG. 3, in the sealing structure 11, the rib 23 has a fastening surface 23b at substantially the same position as the sealing surface 21a of the protrusion member 21 in a third direction Z. Accordingly, the rib 23 has the discharge surface 23a and the fastening surface 23b alternately arranged along the circumferential direction of the protrusion member 21.

The fastening surface 23b of the rib 23 has screw holes 23c into which respective shaft parts of the plurality of screw members 3 are screwed. Thus, while the back surface of the first cover member 30 is in abutment with the fastening surface 23b of the rib 23, the screw members 3 are inserted into the respective through holes 32, and the shaft parts of the screw members 3 are screwed into respective screw holes 23c of the rib 23, whereby the first cover member 30 is fastened and fixed to the case 10.

Figure 4:
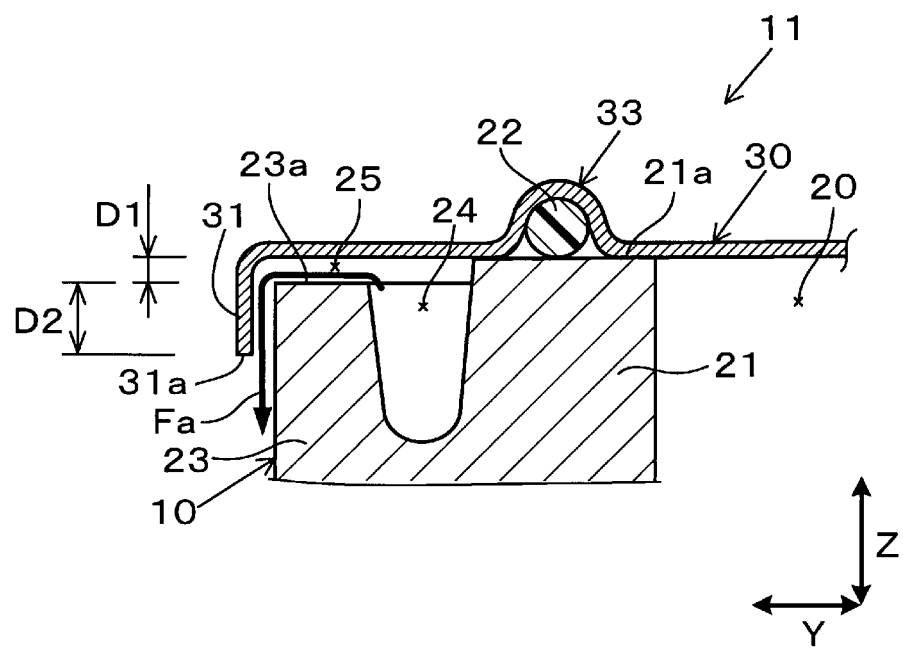
FIG. 4 is a cross-sectional view taken along line IV-IV of FIG. 1.

As illustrated in FIG. 4, the sealing structure 11 has a clearance 25 of a dimension D1 (>0) in a third direction Z between the first cover member 30 and the discharge surface 23a of the rib 23. The first cover member 30 has an extension member 31 extending along the rib 23. The extension member 31 has a dimension D2 (>0) in the third direction Z from a portion at the same position as the discharge surface 23a of the rib 23 in the third direction Z to an extension leading end 31a. Thus, the extension member 31 of the first cover member 30 extends to be lower than the discharge surface 23a of the rib 23 while the case 10 is arranged with the opening 20 facing upward.

According to the sealing structure 11, when the case 10 is arranged with the opening 20 facing upward, the extension member 31 of the first cover member 30 can block a straight path in which a liquid would flows past the rib 23 from the side and reach the sealing surface 21a of the protrusion member 21. This prevents the liquid from directly hitting the sealing surface 21a of the protrusion member 21 due to its momentum, so that the liquid is unlikely to reach the sealing surface 21a.

Examples of the "liquid" here typically include car washing water for washing a vehicle at high pressure, muddy water and salt water splashed onto a vehicle during running, rain water, high-pressure water used in sealing resistance tests, and the like.

When the case 10 is arranged with the opening 20 facing upward, the discharge surface 23a of the rib 23 is located at a lower position than the sealing surface 21a of the protrusion member 21 so that the liquid is prone to flow toward the discharge surface 23a under gravity due to a difference in height between the discharge surface 23a and the sealing surface 21a, and is less prone to remain on the sealing surface 21a of the protrusion member 21. This makes it possible to prevent the liquid having entered into the sealing surface 21a of the protrusion member 21 from deteriorating the sealing surface 21a and the sealing member 22 provided on the sealing surface 21a and infiltrating into the opening 20.

For example, even if the case 10 is formed by aluminum-die-casting, it is possible to prevent the occurrence of a phenomenon that an aluminum material is eroded by a liquid attached to the sealing surface 21a.

Further, providing the groove 24 in the discharge surface 23a of the rib 23 makes it possible to temporarily trap the liquid in the groove 24. Even if the groove 24 becomes infiltrated by the liquid in excess of its capacity, the liquid can be discharged to the outside through the clearance 25 as shown by an arrow Fa. This prevents the liquid from reaching the sealing surface 21a of the protrusion member 21 through the groove 24.

Providing the groove 24 achieves weight saving of the case 10 as compared to a case without the groove 24.

Figure 5:
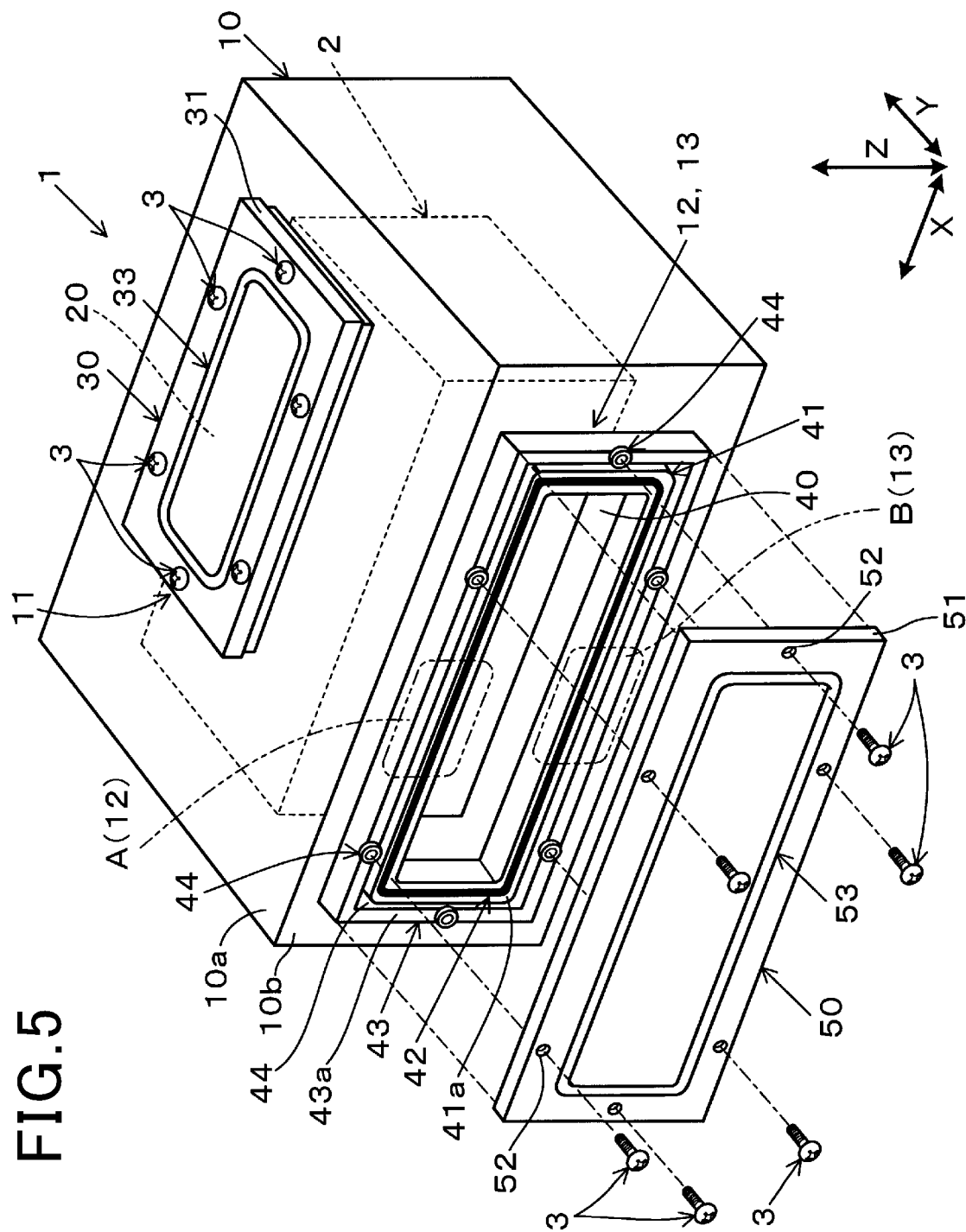
FIG. 5 is a diagram illustrating the power converter illustrated in FIG. 1 in which a second cover member is removed from the case.

As illustrated in FIG. 5, the case 10 includes an protrusion member 41 and a rib 43 on its side surface 10b.

The protrusion member 41 has a sealing surface 41a that is annularly protruded to surround the opening 40. A sealing member 42 is arranged on the sealing surface 41a. The sealing member 42 is formed by a gasket similar to the sealing member 22, which is stored and held in a space between a concave part 53 provided in the second cover member 50 and the sealing surface 41a of the protrusion member 41.

When the second cover member 50 is fastened and fixed to the case 10, the sealing surface 41a of the protrusion member 41 is joined to the back surface of the second cover member 50 via the sealing member 42 to seal the opening 40.

The rib 43 is annularly protruded to surround the outer periphery of the protrusion member 41. That is, the rib 43 is protruded on the opposite side of the opening 40 with the protrusion member 41 interposed therebetween. The rib 43 has a discharge surface 43a connected to the sealing surface 41a of the protrusion member 41. The discharge surface 43a of the rib 43 is located to be lower than the sealing surface 41a of the protrusion member 41 while the case 10 is arranged with the opening 40 facing upward. In this case, the sealing surface 41a and the discharge surface 43a are adjacent to each other to form a step of a constant dimension between the sealing surface 41a and the discharge surface 43a.

The rib 43 has a groove 44 that is a concave part in the discharge surface 43a. The groove 44 is formed as an annular groove that extends along the protrusion member 21.

The foregoing sealing structures 12 and 13 will be described in detail with reference to FIGS. 6 to 9.

Figure 6:
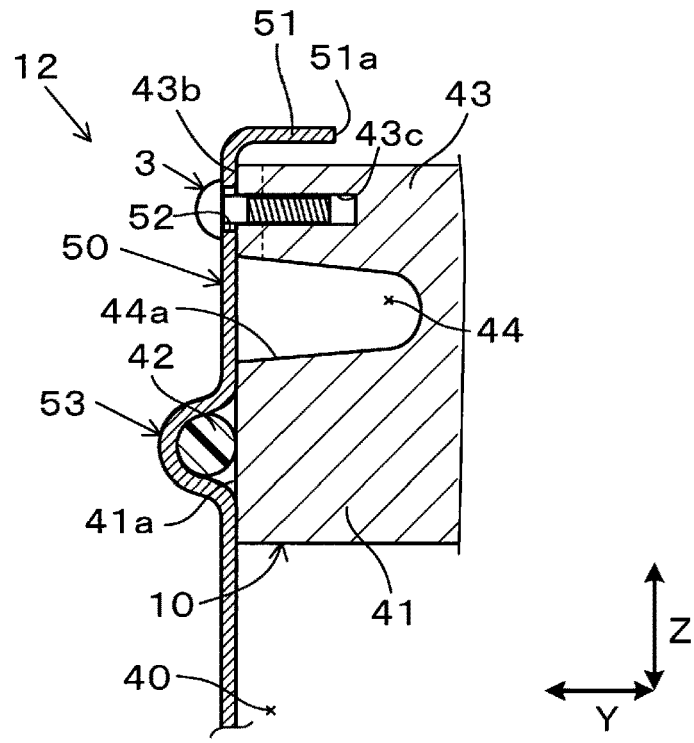
FIG. 6 is a cross-sectional view taken along line VI-VI of FIG. 1.

As illustrated in FIG. 6, in the sealing structure 12 in the upper region of the second cover member 50, the rib 43 has a fastening surface 43b at substantially the same position as the sealing surface 41a of the protrusion member 41 in a second direction Y. Accordingly, the rib 43 has the discharge surface 43a and the fastening surface 43b alternately arranged along a circumferential direction of the protrusion member 41.

The fastening surface 43b of the rib 43 has screw holes 43c into which respective shaft parts of the plurality of screw members 3 are screwed respectively. Thus, while the back surface of the second cover member 50 is in abutment with the fastening surface 43b of the rib 43, the screw members 3 are inserted into the through holes 52 respectively, and the shaft parts of the screw members 3 are screwed into the screw holes 43c of the rib 43 respectively, whereby the second cover member 50 is fastened and fixed to the case 10.

Figure 7:
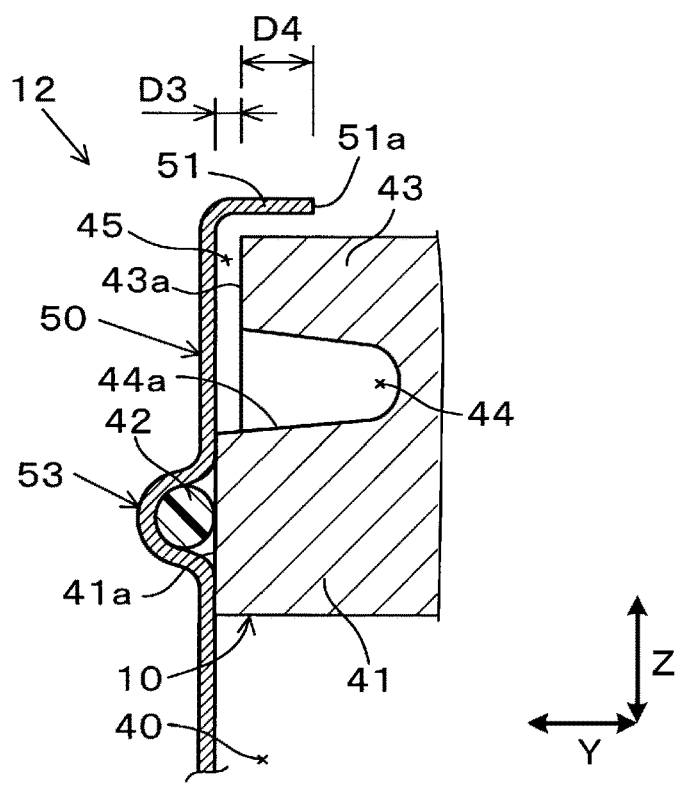
FIG. 7 is a cross-sectional view taken along line VII-VII of FIG. 1.

As illustrated in FIG. 7, the sealing structure 12 has a clearance 45 of a dimension D3 (>0) in the second direction Y between the second cover member 50 and the discharge surface 43a of the rib 43. The second cover member 50 has an extension member 51 extending along the rib 43. The extension member 51 has a dimension D4 (>0) in the second direction Y from a portion at the same position as the discharge surface 43a of the rib 43 in the second direction Y to an extension leading end 51a. Thus, the extension member 51 of the second cover member 50 extends to be lower than the discharge surface 43a of the rib 43 while the case 10 is arranged with the opening 40 facing upward.

According to the sealing structure 12, the extension member 51 of the second cover member 50 can block a straight path in which a liquid would flow past the rib 43 from above and reach the sealing surface 41a of the protrusion member 41. This prevents the liquid from directly hitting the sealing surface 41a of the protrusion member 41 due to its momentum so that the liquid is unlikely to reach the sealing surface 41a.

Figure 8:
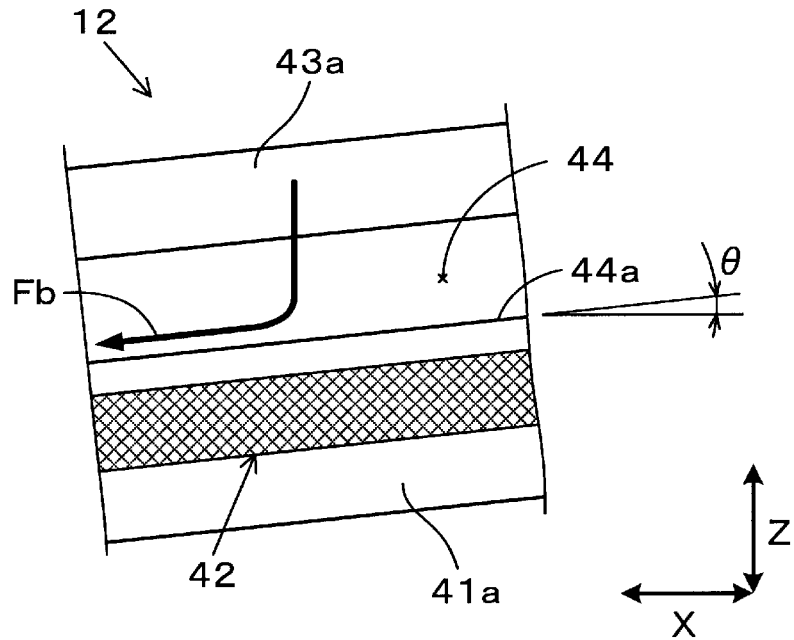
FIG. 8 is a side view of a region A illustrated in FIG. 5.

As illustrated in FIGS. 7 and 8 (see the region A illustrated in FIG. 5), in the sealing structure 12, the groove 44 has an inclined surface 44a that is inclined at an angle θ with respect to the horizontal direction and is configured to guide the liquid in an extending direction of the groove 44. Thus, the liquid having flowed into the groove 44 through the clearance 45 (see FIG. 7) can be guided over the inclined surface 44a in a downward inclination direction under gravity as shown by an arrow Fb, and discharged from the groove 44 (see FIG. 8).

Figure 9:
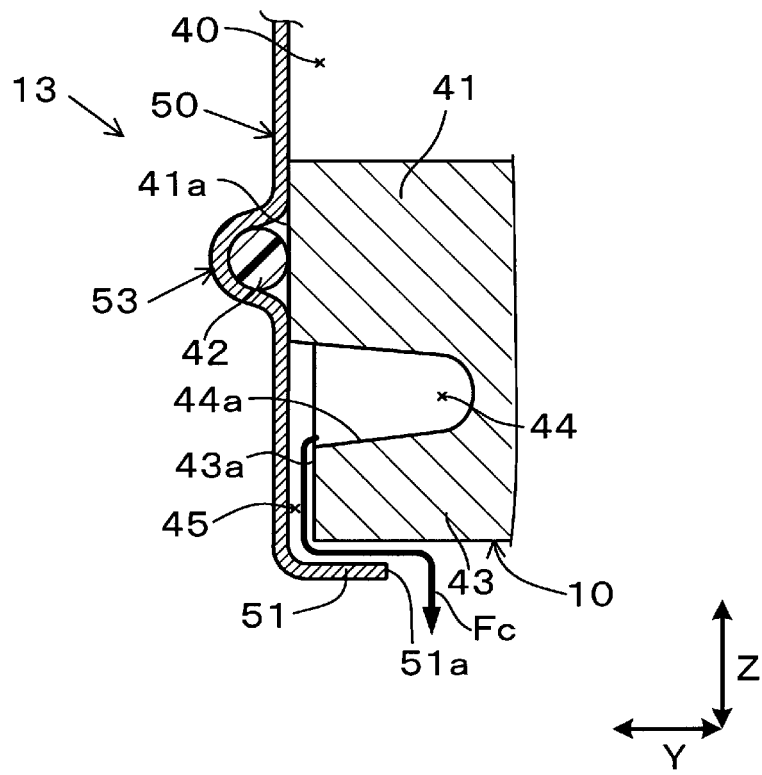
FIG. 9 is cross-sectional view taken along line IX-IX of FIG. 1.

On the other hand, as illustrated in FIG. 9, in the sealing structure 13 in the lower region of the second cover member 50, the extension member 51 of the second cover member 50 can block a straight path in which a liquid would flow from below past the rib 43 and reach the sealing surface 41a of the protrusion member 41. This prevents the liquid from directly hitting the sealing surface 41a of the protrusion member 41 due to its momentum so that the liquid is unlikely to reach the sealing surface 41a.

Figure 10:
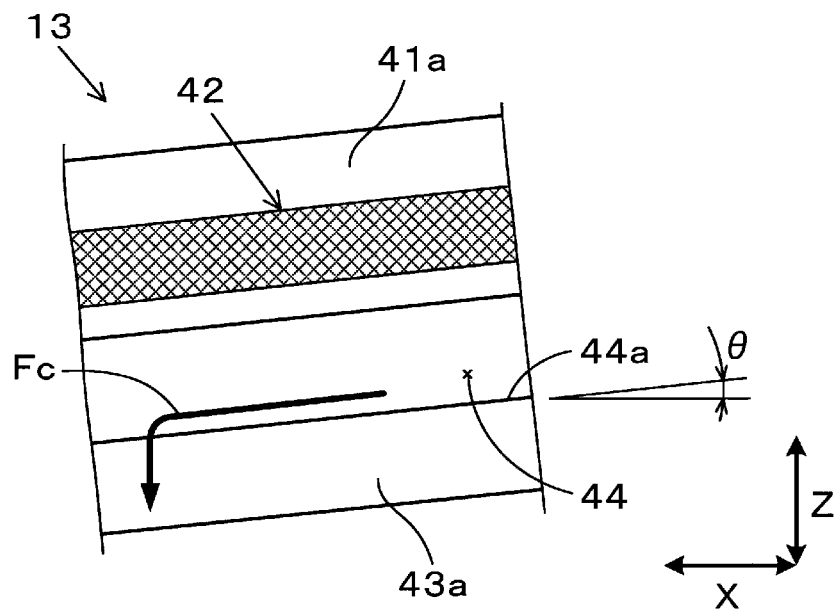
FIG. 10 is a side view of a region B illustrated in FIG. 5.

As illustrated in FIGS. 9 and 10 (see the region B illustrated in FIG. 5), in the sealing structure 13, the groove 44 has an inclined surface 44a that is inclined at an angle θ with respect to the horizontal direction. The inclined surface 44a is preferably inclined to be lower with increasing proximity to the outside, that is, with increasing proximity to the second cover member 50. Accordingly, the liquid having entered into the groove 44 through the clearance 45 (see FIG. 9) can be guided over the inclined surface 44a under gravity in an inclined downward direction and a downward direction as shown by an arrow Fc, and discharged from the groove 44 (see FIG. 10).

When the case 10 is arranged with the opening 20 in landscape orientation, that is, when the case 10 is arranged in landscape orientation such that the opening 20 is located on a side surface, the sealing structure 11 produces the same operations and advantageous effects as those of the sealing structures 12 and 13 described above.

Figure 11:
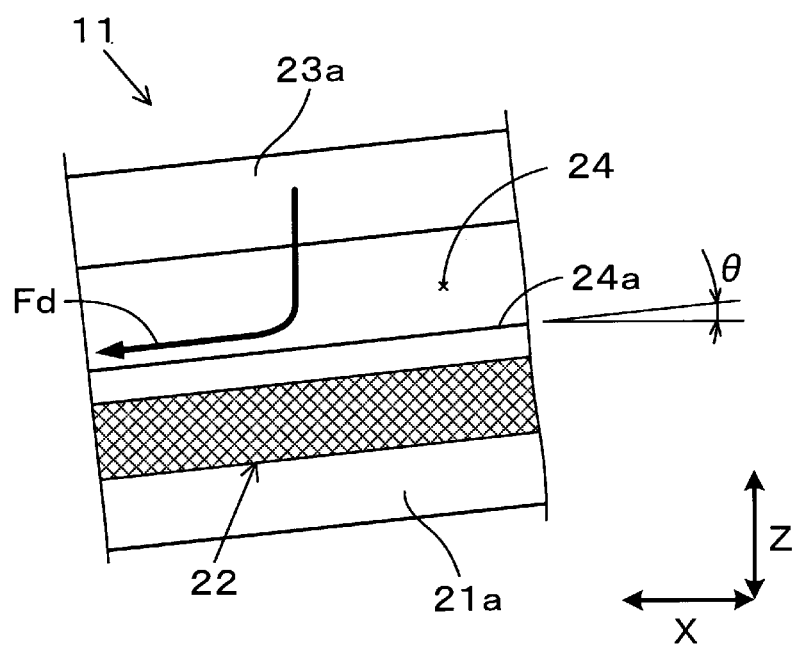
FIG. 11 is a side view of a sealing structure that is located on a side surface of the case illustrated in FIG. 1 and arranged in landscape orientation.

As illustrated in FIG. 11, when the case 10 is arranged in landscape orientation, the groove 24 in the sealing structure 11 in the upper region of the first cover member 30 has an inclined surface 24a that is inclined at an angle θ with respect to the horizontal direction and is configured to guide a liquid. Accordingly, the liquid having entered into the groove 24 through the clearance 25 (see FIG. 4) can be guided over the inclined surface 24a under gravity in an inclined downward direction as shown by an arrow Fd, and discharged from the groove 24.

Figure 12:
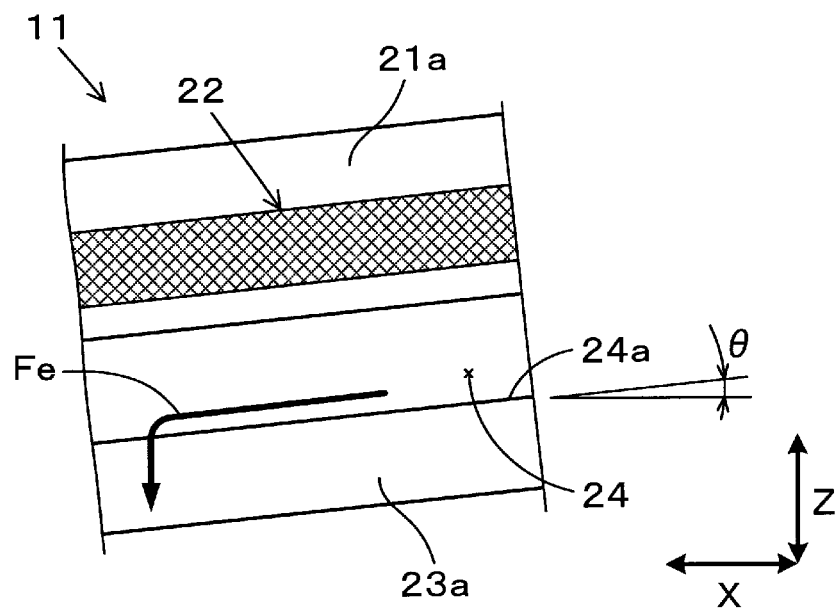
FIG. 12 is a side view of the sealing structure that is located on a side surface of the case illustrated in FIG. 1 and arranged in landscape orientation.

As illustrated in FIG. 12, when the case 10 is arranged with the opening 20 in landscape orientation, in the sealing structure 11 in the lower region of the first cover member 30, the inclined surface 24a of the groove 24 is preferably inclined to be lower with increasing proximity to the outside, that is, with increasing proximity to the first cover member 30. Accordingly, the liquid having entered into the groove 24 through the clearance 25 can be guided over the inclined surface 24a under gravity in an inclined downward direction and a downward direction as shown by an arrow Fe, and discharged from the groove 24.

Although not illustrated in the drawings, when the case 10 is arranged with the opening 40 facing upward, the sealing structures 12 and 13 produce operations and advantageous effects similar to those of the sealing structure 11 described above.

Hereinafter, other embodiments related to the first embodiment will be described with reference to the drawings. In the other embodiments, the same elements as those of the first embodiment are given the same reference signs and thus duplicate description of the same elements will be omitted.

Reference Example

Figure 13:
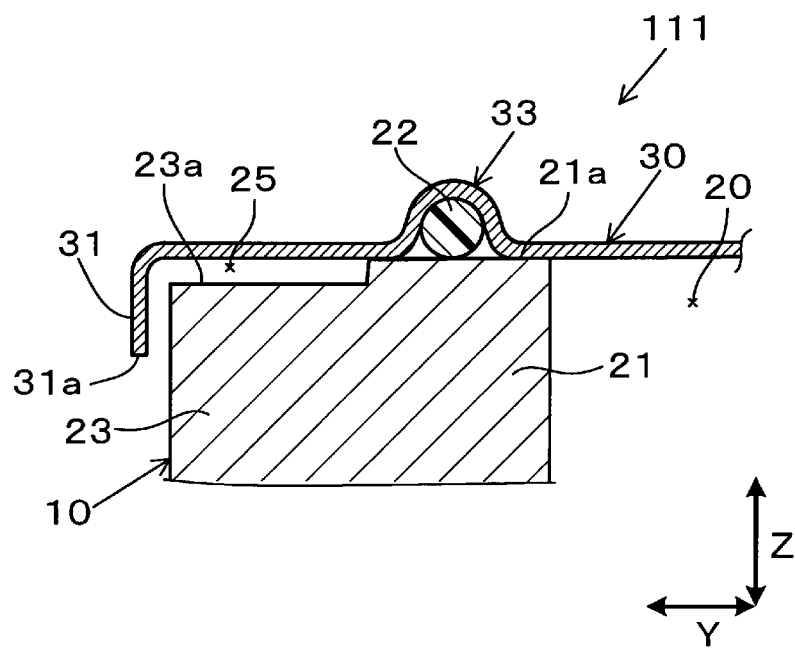
FIG. 13 is a cross-sectional view of a sealing structure according to a reference example.

As illustrated in FIG. 13, a sealing structure 111 in a reference example is different from the sealing structure 11 in the first embodiment in that such a concave part as the groove 24 (see FIG. 4) is not provided in the discharge surface 23a of the rib 23.

As for other components, the sealing structure 111 is similar to the sealing structure 11 in the first embodiment.

According to the reference example, the discharge surface 23a of the rib 23 can be simplified in shape.

In other respects, the sealing structure 111 produces operations and advantageous effects similar to those of the sealing structure 11 in the first embodiment.

As another reference example, the feature of the sealing structure 111 in the reference example can also be applied to the sealing structures 12 and 13 in the first embodiment. That is, the groove 44 (see FIGS. 7 and 9) can be omitted from the discharge surface 43a of the rib 43 in the sealing structures 12 and 13 in the first embodiment.

As a modification example of the sealing structure 111 in the reference example, another reference example in which the discharge surface 23a of the rib 23 is changed to a surface that is linearly inclined to be lower with increasing proximity to the outer periphery or to a curved surface can be adopted.

Third Embodiment

Figure 14:
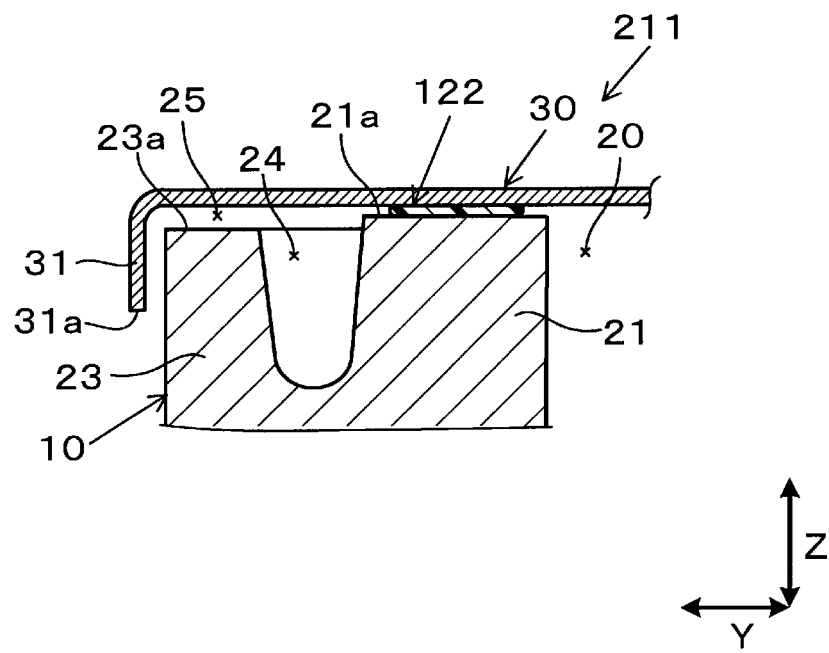
FIG. 14 is a cross-sectional view of a sealing structure according to a third embodiment.

As illustrated in FIG. 14, a sealing structure 211 in a third embodiment is different from the sealing structure 11 in the first embodiment in that a liquid sealing material 122 is used instead of the sealing member 22. The sealing material 122 is applied to the sealing surface 21a of the protrusion member 21, and then is dried or homogenized after a lapse of a constant time to form an elastic film or a thin viscous layer with liquid-tight properties to demonstrate liquid tightness. In this case, the concave part 33 of the first cover member 30 (see FIG. 4) is omitted.

As for other components, the sealing structure 211 is similar to the sealing structure 11 in the first embodiment.

According to the third embodiment, it is possible to implement the sealing structure 211 with the liquid sealing material 122 instead of a gasket. The first cover member 30 can be simplified in shape as compared to the first embodiment.

In other respects, the sealing structure 211 produces operations and advantageous effects similar to those of the sealing structure 11 in the first embodiment.

The feature of the sealing structure 211 in the third embodiment can also be applied to the sealing structures 12 and 13 in the first embodiment. That is, instead of the sealing member 42, a sealing material similar to the sealing material 122 can be used in the sealing structures 12 and 13 in the first embodiment.

Fourth Embodiment

Figure 15:
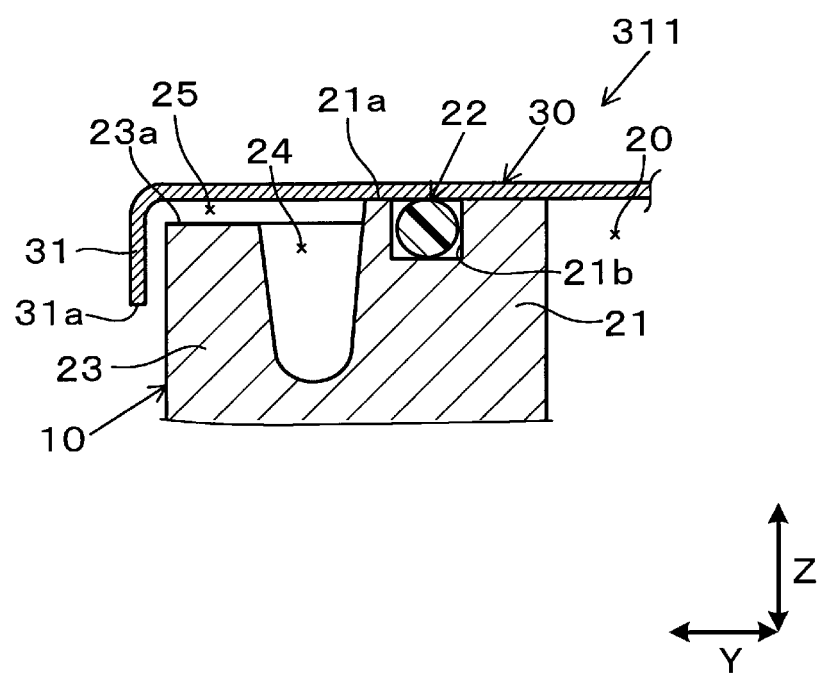
FIG. 15 is a cross-sectional view of a sealing structure according to a fourth embodiment.

As illustrated in FIG. 15, a sealing structure 311 in a fourth embodiment is different from the sealing structure 11 in the first embodiment in that the sealing surface 21a of the protrusion member 21 has a concave part 21b for storing the sealing member 22. Thus, the concave part 33 of the first cover member 30 (see FIG. 4) is omitted.

As for other components, the sealing structure 311 is similar to the sealing structure 11 in the first embodiment.

According to the fourth embodiment, the first cover member 30 can be simplified in shape as compared to the first embodiment.

In other respects, the sealing structure 311 provides operations and advantageous effects similar to those of the sealing structure 11 in the first embodiment.

The feature of the sealing structure 311 in the fourth embodiment can also be applied to the sealing structures 12 and 13 in the first embodiment.

Fifth Embodiment

Figure 16:
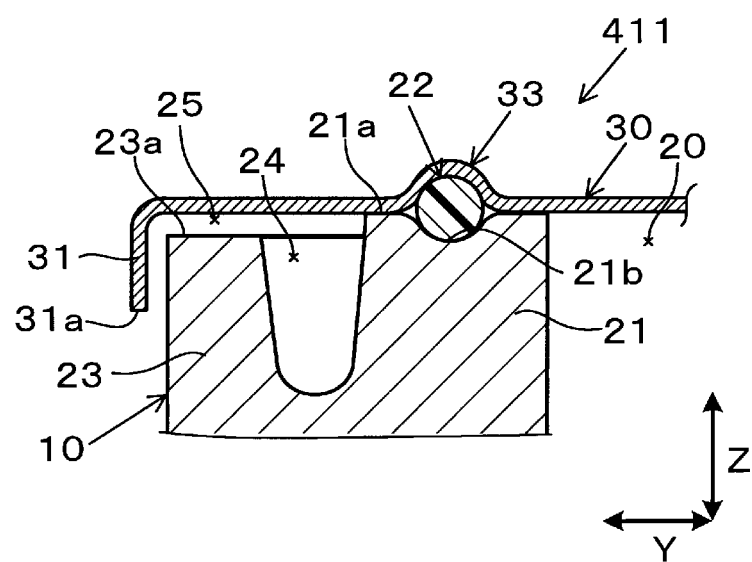
FIG. 16 is a cross-sectional view of a sealing structure according to a fifth embodiment.

As illustrated in FIG. 16, a sealing structure 411 in a fifth embodiment is different from the sealing structure 11 in the first embodiment in that the sealing surface 21a of the protrusion member 21 has a concave part 21b for storing the sealing member 22 and that both the concave part 21b and the concave part 33 of the first cover member 30 form a space for storing and holding the sealing member 22.

As for other components, the sealing structure 411 is similar to the sealing structure 11 in the first embodiment.

According to the fifth embodiment, the dimensions of the concave part 33 of the first cover member 30 can be reduced as compared to the first embodiment.

In other respects, the sealing structure 411 produces operations and advantageous effects similar to those of the sealing structure 11 in the first embodiment.

The feature of the sealing structure 411 in the fifth embodiment can also be applied to the sealing structures 12 and 13 in the first embodiment.

The present disclosure has been described in conformity with the embodiments. However, it is to be understood that the present disclosure is not limited to the embodiments or structures. The present disclosure includes various modified examples and modifications within the range of equivalency. In addition, various combinations and forms or other combinations and forms including only one additional element, two or more additional elements, or a portion of one additional element are also included in the scope of the present disclosure or the range of ideas.

In the foregoing embodiments, there are two combinations of the opening in the case 10 and the cover member covering the opening as an example. However, the number of combinations is not limited to two but may be one or three or more.

In the foregoing embodiments, as an example, the case 10 has the groove 24 to continuously extend along the protrusion member 21 in the discharge surface 23a of the rib 23 and has the groove 44 to continuously extend along the protrusion member 41 in the discharge surface 43a of the rib 43. Alternatively, at least one of the groove 24 and the groove 44 can be a non-continuous concave part.

In the foregoing embodiments, as an example, when the case 10 is directed to a predetermined direction when the power converter 1 is used normally, the inclined surface 44a of the groove 44 is inclined with respect to the horizontal direction, and when the case 10 is arranged in landscape orientation, the inclined surface 24a of the groove 24 is inclined with respect to the horizontal direction. Alternatively, when the case 10 is arranged in normal orientation, the inclined surface 44a of the groove 44 can extend in the horizontal direction, and when the case 10 is arranged in landscape orientation, the inclined surface 24a of the groove 24 can extend in the horizontal direction.

In relation to the foregoing embodiments, the sealing structures for the case 10 of the power converter 1 have been described as examples. However, the sealing structures are also applicable to sealing structures for cases that store battery units or ECUs.

What is claimed is:

1. A sealing structure of a case for an in-vehicle electronic component, comprising:
a case that (i) is configured to store an in-vehicle electronic component, (ii) has walls configured to face all surfaces of the electronic component, and (iii) has an opening (1) through one wall of the walls of the case and that extends between an interior surface of the one wall and an exterior surface of the one wall and (2) having a longitudinal axis extending through the one wall; and
a cover member that covers the opening through the one wall and part of the one wall but does not cover an entirety of the one wall, wherein
the case includes:
a protrusion member that has a sealing surface (1) on an end of the protrusion member in a direction parallel to the longitudinal axis, (2) facing away from an interior of the case, (3) that surrounds the opening and (4) facing the cover member; and
a rib on an opposite side of the protrusion member from the opening such that an entirety of the protrusion member is between the rib and the opening in a direction perpendicular to the longitudinal axis,
the rib has a discharge surface (1) on an end of the rib in the direction parallel to the longitudinal axis, (2) that faces a same direction as the sealing surface and (3) that is connected to the sealing surface of the protrusion member,
the cover member has an extension member that extends along the rib when the cover member covers the opening,
the discharge surface of the rib is lower than the sealing surface of the protrusion member when the case is arranged with the opening facing upward,
the extension member of the cover member is lower than the discharge surface of the rib when the case is arranged with the opening facing upward,
the rib has a concave part in the discharge surface with a concave part opening facing upward when the case is arranged with the opening facing upward, and
the case and the cover member are configured such that the discharge surface is spaced from the cover member in a direction parallel to the longitudinal axis when the cover member is attached to the case.

2. The sealing structure of a case for an in-vehicle electronic component according to claim 1, wherein the concave part is configured as a groove to continuously extend along the protrusion member.

3. The sealing structure of a case for an in-vehicle electronic component according to claim 2, wherein the groove has an inclined surface that is inclined with respect to a horizontal direction and is configured to guide a liquid in an extending direction of the groove when the case is arranged with the opening extending in the horizontal direction.

4. The sealing structure of a case for an in-vehicle electronic component according to claim 1, further comprising:

a seal configured to be between and directly contacted by the sealing surface and the cover when the cover is attached to the case.

\* \* \* \* \*